(12) United States Patent
Zhu

(10) Patent No.: US 11,451,221 B2
(45) Date of Patent: Sep. 20, 2022

(54) DUAL CLOCK SIGNAL TO PULSE-WIDTH MODULATED SIGNAL CONVERSION CIRCUIT

(71) Applicant: SHANGHAI GUESTGOOD ELECTRONICS CO. LTD., Shanghai (CN)

(72) Inventor: Jinqiao Zhu, Shanghai (CN)

(73) Assignee: LINEARIN TECHNOLOGY CORPORATION, Shanghai (CN)

( * ) Notice: Subject to any disclaimer, the term of this patent is extended or adjusted under 35 U.S.C. 154(b) by 0 days.

(21) Appl. No.: 17/276,672

(22) PCT Filed: Sep. 4, 2019

(86) PCT No.: PCT/CN2019/104377
§ 371 (c)(1),
(2) Date: Mar. 16, 2021

(87) PCT Pub. No.: WO2020/057370
PCT Pub. Date: Mar. 26, 2020

(65) Prior Publication Data
US 2022/0038086 A1   Feb. 3, 2022

(30) Foreign Application Priority Data
Sep. 21, 2018  (CN) .......................... 201811108793.3

(51) Int. Cl.
*H03K 5/00*  (2006.01)
*H03K 5/24*  (2006.01)
(Continued)

(52) U.S. Cl.
CPC .......... *H03K 5/249* (2013.01); *H03K 5/1534* (2013.01); *H03K 7/08* (2013.01); *H03K 19/1774* (2013.01);
(Continued)

(58) Field of Classification Search
None
See application file for complete search history.

(56) References Cited

U.S. PATENT DOCUMENTS 6,545,621 B1 * 4/2003 Madni ...................... H03K 7/08
341/143
7,027,352 B2   4/2006 Jung
(Continued)

FOREIGN PATENT DOCUMENTS

CN   1503362 A   6/2004
CN   1846391 A   10/2006
(Continued)

OTHER PUBLICATIONS

PCT International Search Report dated Nov. 22, 2019 in connection with PCT International Patent Application No. PCT/CN2019/104377.

*Primary Examiner* — Tuan T Lam
(74) *Attorney, Agent, or Firm* — Amster, Rothstein & Ebenstein LLP

(57) ABSTRACT

Disclosed is a dual clock signal to pulse-width modulated signal conversion circuit, comprising: a first counter, an input end of which inputs a first clock signal, and an output end of which outputs a divided signal; an edge reset circuit, an input end of which inputs the divided signal, the output end of which outputs a first reset pulse signal and a second reset pulse signal, the first reset pulse signal being configured for resetting a second counter, and the second reset pulse signal being configured for resetting a third counter; a second counter, an input end of which inputs the second clock signal and the first reset pulse signal, and an output end of which outputs the first pulse-width modulated signal; a third counter, an input end of which inputs the second clock signal and the second reset pulse signal, and an output end of which outputs the second pulse-width modulated signal;

(Continued)

a logic processing circuit, an input end of which inputs the first pulse-width modulated signal and the second pulse-width modulated signal, and an output end of which outputs a pulse-width modulated signal PWM_OUT. The disclosure offers high precision, system stability, and good anti-interference.

11 Claims, 1 Drawing Sheet

(51) Int. Cl.
    *H03K 5/1534*    (2006.01)
    *H03K 7/08*    (2006.01)
    *H03K 19/17736*    (2020.01)
    *H03K 21/02*    (2006.01)

(52) U.S. Cl.
    CPC ... H03K 21/02 (2013.01); *H03K 2005/00247* (2013.01)

(56) References Cited

U.S. PATENT DOCUMENTS

| | | | |
|---|---|---|---|
| 7,251,573 B2 | 7/2007 | Sanduleanu et al. | |
| 7,932,761 B1* | 4/2011 | Esposito | H03K 7/08 327/175 |
| 8,305,126 B2 | 11/2012 | Smith et al. | |
| 8,344,783 B2 | 1/2013 | Ko et al. | |
| 9,179,519 B2 | 11/2015 | Chen et al. | |
| 9,543,960 B1* | 1/2017 | He | H03K 21/10 |
| 2004/0099883 A1* | 5/2004 | Jung | H03L 7/0814 257/200 |
| 2004/0240540 A1* | 12/2004 | Matsushima | H05B 45/14 375/238 |
| 2005/0213654 A1* | 9/2005 | Figoli | H03K 7/08 375/238 |
| 2007/0021933 A1 | 1/2007 | Sanduleanu et al. | |
| 2008/0013962 A1 | 1/2008 | Nishikawa | |
| 2011/0204950 A1 | 8/2011 | Ko et al. | |
| 2012/0112811 A1* | 5/2012 | Cook | H03K 7/08 327/175 |
| 2012/0182055 A1 | 7/2012 | Smith et al. | |
| 2013/0169173 A1 | 7/2013 | Chen et al. | |
| 2019/0123725 A1* | 4/2019 | Vulpoiu | H03K 3/017 |
| 2020/0358431 A1* | 11/2020 | Dubey | H03K 7/08 |

FOREIGN PATENT DOCUMENTS

| | | |
|---|---|---|
| CN | 1981436 A | 6/2007 |
| CN | 102170279 A | 8/2011 |
| CN | 102497710 A | 6/2012 |
| CN | 103314530 A | 9/2013 |
| CN | 109088624 A | 12/2018 |
| JP | H09200008 A | 7/1997 |

* cited by examiner

US 11,451,221 B2

DUAL CLOCK SIGNAL TO PULSE-WIDTH MODULATED SIGNAL CONVERSION CIRCUIT

CROSS-REFERENCE TO RELATED APPLICATIONS

This application is a U.S. national stage entry under 35 U.S.C. § 371 of PCT International Patent Application No. PCT/CN2019/104377, filed Sep. 4, 2019, which claims priority to Chinese Patent Application No. CN 201811108793.3, filed Sep. 21, 2018, the contents of each of which are incorporated herein by reference in their entirety.

TECHNICAL FIELD

Embodiments of the present disclosure relate to a dual clock signal to pulse-width modulated signal conversion circuit.

BACKGROUND

Pulse-width modulation (PWM) is a technology applied in a wide array of industrial control systems, which is essential for motor speed control, signal isolation, dimmer switching, and analog-to-digital conversion. Major concerns in such systems are speed and precision of a pulse-width modulated (PWM) signal.

Despite wide applications of the PWM signal technology, solutions for a PWM signal generation circuit have not been well developed yet. Currently, two types of mainstream technologies are available. First, a solution of cutting the triangular wave by a voltage value, which is an analog-only circuit solution. As it is hard to precisely control the peaks of the triangular wave and the linearity of rising and falling, the absolute precision and linearity of the PWM signal produced in an open-loop operating mode are not satisfactory. Second, a digital circuit-based logic value to PWM signal conversion solution, which has a good PWM precision and linearity. However, that solution adopts a digital-only circuit interface, while a large number of analog quantities in industrial control requires introduction of an analog-to-digital converter and a corresponding control circuit. Therefore, the digital circuit-based logic value to PWM signal conversion solution is generally embodied as a microcontroller; however, the microcontroller-based solution would further induce problems in system stability and anti-interference; besides, the performance of the analog-to-digital converter would also deteriorate system performance.

SUMMARY OF THE INVENTION

Embodiments of the present disclosure provide a dual clock signal to pulse-width modulated (PWM) signal conversion circuit, which realizes high-precision PWM signal output, wherein the duty of the PWM signal is equivalent to the ratio of the cycles of the two ways of frequency signals; besides, the frequency signals and the PWM signals all have dual properties of analog and digit, such that this structure is suitable for application to analog-to-digital conversion and digital-to-analog conversion; and products based on this structure have properties such as high precision, system stability, and good anti-interference.

Embodiments of the present disclosure provide a dual clock signal to pulse-width modulated signal conversion circuit, an input end of which inputs a first clock signal and a second clock signal, and an output end of which outputs a pulse-width modulated signal.

clock cycle $T_0$ of the first clock signal is greater than or equal to clock cycle $T_1$ of the second clock signal;

high-level average duty cycle of the pulse-width modulated signals is equal to the ratio of the cycle $T_0$ of second clock signal to the clock cycle $T_1$ of the first clock signal cycle, multiplied by a proportionality coefficient K, namely, $K \times (T_0/T_1)$, or equal to 1 minus the ratio of the clock cycle $T_0$ of second clock signal to the clock cycle $T_1$ of the first clock signal, multiplied by the proportionality coefficient K, i.e., $1 - K \times (T_0/T_1)$.

The proportionality coefficient $K = \frac{1}{2^n}$, where the variable n is an integer.

The variable n is 0.

Low-level pulse duration and high-level pulse duration of the pulse-width modulated signals are both equal to an integer multiplicity of the clock cycle $T_0$ of the second clock signal.

The dual clock signal to pulse-width modulated signal conversion circuit comprises:

a pulse-width modulation circuit, an input end of which inputs a first clock signal and a second clock signal, and an output end of which outputs a first pulse-width modulated signal and a second pulse-width modulated signal;

a logic processing circuit, an input end of which inputs the first pulse-width modulated signal and the second pulse-width modulated signal, and an output end of which outputs a pulse-width modulated signal PWM_OUT.

Average frequency of the first pulse-width modulated signal is equal to that of the second pulse-width modulated signal, cycle of the first pulse-width modulated signal and cycle of the second pulse-width modulated signal being both equal to an integer multiplicity of the clock cycle of the second clock signal.

Low-level average duty cycle of the first pulse-width modulated signal and low-level average duty cycle of the second pulse-width modulated signal are equal to ½ of the ratio of the clock cycle $T_0$ of the second clock signal to the clock cycle of the first clock signal, or equal to 1 minus ½ of the ratio of the clock cycle $T_0$ of the second clock signal to the clock cycle of the first clock signal.

Average frequency of the first pulse-width modulated signal is equal to frequency of a divided signal, low-level pulse duration and high-level pulse duration of the first pulse-width modulated signal are both an integer multiplicity of the clock cycle of the second clock signal. Average frequency of the second pulse-width modulated signal is equal to frequency of the divided signal, and low-level pulse duration and high-level pulse duration of the second pulse-width modulated signal are both an integer multiplicity of the clock cycle of the second clock signal.

The logic processing circuit performs a logic AND operation on the first pulse-width modulated signal and the second pulse-width modulated signal.

The pulse-width modulation circuit comprises:

a first counter, an input end of which inputs the first clock signal, and an output end of which outputs the divided signal;

an edge reset circuit, an input end of which inputs the divided signal, the output end of which outputs a first reset pulse signal and a second reset pulse signal, the first reset pulse signal being configured for resetting a second counter, and the second reset pulse signal being configured for resetting a third counter;

a second counter, an input end of which inputs the second clock signal and the first reset pulse signal, and an output end of which outputs the first pulse-width modulated signal;

a third counter, an input end of which inputs the second clock signal and the second reset pulse signal, and an output end of which outputs the second pulse-width modulated signal.

Cycle of the divided signal is an integer multiplicity of the first clock signal cycle.

The edge reset circuit generates a first reset pulse signal at a rising edge of the divided signal, and generates a second reset pulse signal at the falling edge of the divided signal.

Embodiments of the present disclosure realizes precise PWM signal output, wherein the duty cycle of the PWM signal is equivalent to the ratio of the cycles of two clock signals; besides, the frequency signals and the PWM signal PWM_OUT have dual properties of analog and digit; therefore, this structure is suitable for application to analog-to-digital conversion and digit-to-analog conversion; and products based on this structure have properties such as high precision, system stability, and good anti-interference.

DETAILED DESCRIPTION OF EMBODIMENTS

Hereinafter, preferred embodiments of the present disclosure will be illustrated in detail with reference to FIGS. 1~2.

Figure 1:
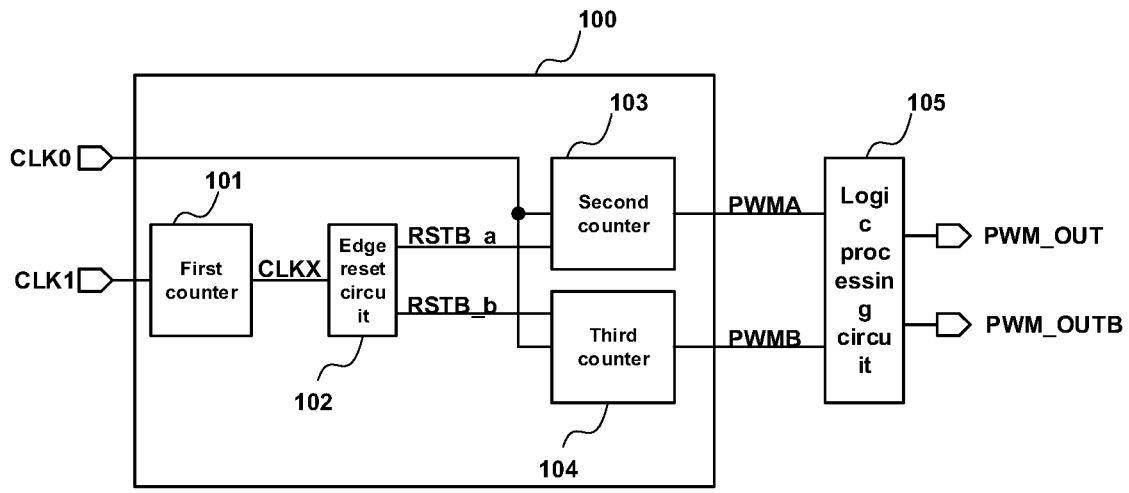
FIG. 1 illustrates a circuit diagram of a dual clock signal to pulse-width modulated signal conversion circuit.

As illustrated in FIG. 1, embodiments of the present disclosure provide a dual clock signal to pulse-width modulated signal conversion circuit, the input end of which outputs two ways of asynchronous clock signals, the output end of which outputs a pulse-width modulated signal PWM_OUT, wherein clock cycle T1 of the first clock signal CLK1 is greater than or equal to clock cycle T0 of the second clock signal CLK0_T0, high-level average duty cycle Duty of the pulse-width modulated signal PWM_OUT is equal to the ratio of the clock cycle of the second clock signal to the clock cycle of the first clock signal, multiplied by a proportionality coefficient K, namely, Duty=K×(T0/T1), or equal to 1 minus the ratio, multiplied by a proportionality coefficient K, of the clock cycle of the second clock signal to the clock cycle of the first clock signal, namely, Duty=1−K×(T0/T1). The cycle of the pulse-width modulated signal is an integer multiplicity of the second clock signal cycle, where the proportionality coefficient K=½$^n$, where the variable n is an integer. In a preferred embodiment of the present disclosure, the variable n is 0.

The dual clock signal to pulse-width modulated signal conversion circuit further comprises:

a pulse-width modulation circuit 100, the input end of which inputs the first clock signal CLK1 and the second clock signal CLK0, and the output end of which outputs a first pulse-width modulated signal PWMA and a second pulse-width modulated signal PWMB, wherein low-level duty cycles of PWMA and PWMB are both T0/(2*T1), and high-level duty cycles thereof are both 1−T0/(2*T1);

a logic processing circuit 105, the input end of which inputs the first pulse-width modulated signal PWMA and the second pulse-width modulated signal PWMB, the output end of which outputs the pulse-width modulated signal PWM_OUT and its inverted signal PWM_OUTB, wherein the logic processing circuit 105 performs logic AND operation on the first pulse-width modulated signal PWMA and the second pulse-width modulated signal PWMB, where PWM_OUT=PWMA & PWMB, and PWM_OUTB=−(PWMA&PWMB).

Average frequency of the first pulse-width modulated signal is equal to average frequency of the second pulse-width modulated signal. Cycle of the first pulse-width modulated signal and cycle of the second pulse-width modulated signal are both equal to an integer multiplicity of the clock cycle of the second clock signal.

The pulse-width modulation circuit 100 further comprises:

a first counter 101, the input end of which inputs the first clock signal CLK1, and the output end of which outputs the divided signal CLKX, wherein cycle of the divided signal CLKX is an integer multiplicity of the clock cycle of the first clock signal CLK1;

an edge reset circuit 102, the input end of which inputs the divided signal CLKX, and the output end of which outputs a first reset pulse signal RSTB_a and a second reset pulse signal RSTB_b, wherein the edge reset circuit 102 generates the first reset pulse signal RSTB_a at the rising edge of the divided signal CLKX, and the edge reset circuit 102 generates the second reset pulse signal RSTB_b at the falling edge of the divided signal CLKX, the first reset pulse signal RSTB_a being configured for resetting a second counter, and the second reset pulse signal RSTB_b is configured for resetting a third counter;

a second counter 103, the input end of which inputs the second clock signal CLK0 and the first reset pulse signal RSTB_a, and the output end of which outputs the first pulse-width modulated signal PWMA, wherein average frequency of the first pulse-width modulated signal PWMA is equal to frequency of the divided signal CLKX, and average cycle of the first pulse-width modulated signal PWMA is equal to average cycle of the first reset pulse signal RSTB_a, and low-level pulse duration and high-level pulse duration of the first pulse-width modulated signal PWMA are both an integer multiplicity of the clock cycle of the second clock signal CLK0;

a third counter 104, the input end of which inputs the second clock signal CLK0 and the second reset pulse signal RSTB_b, and the output end of which outputs the second pulse-width modulated signal PWMB, wherein average frequency of the second pulse-width modulated signal PWMB is equal to the frequency of the divided signal CLKX, and average cycle of the second pulse-width modulated signal PWMB is equal to average cycle of the second reset pulse signal RSTB_b, low-level pulse duration and high-level pulse duration of the second pulse-width modulated signal PWMB being both an integer multiplicity of the clock cycle of the second clock signal CLK0.

Figure 2:
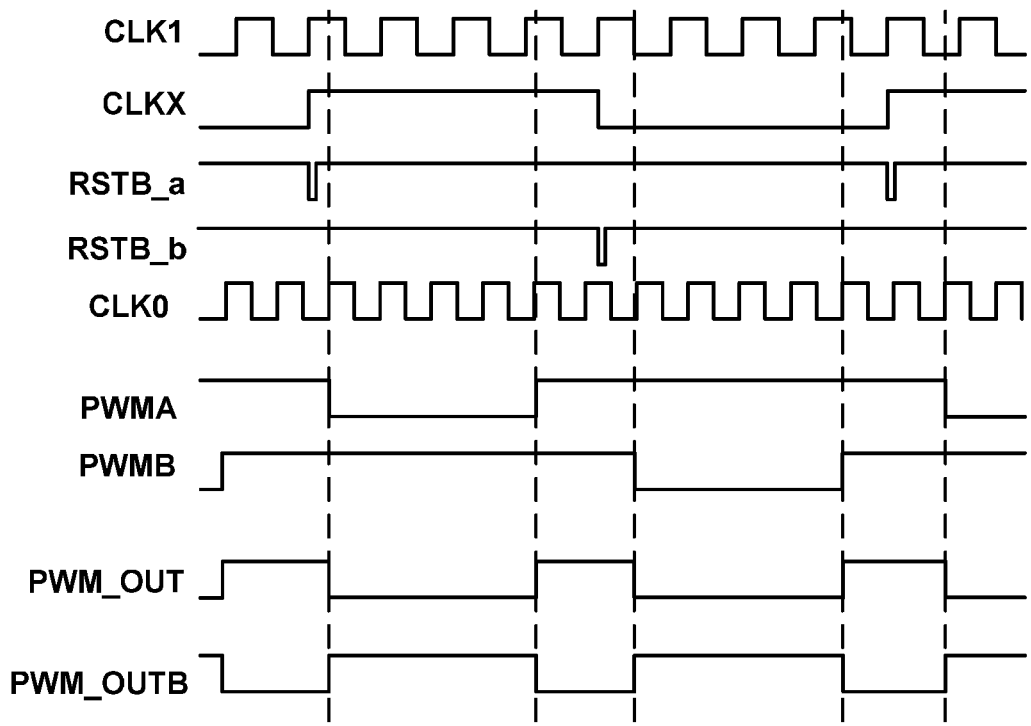
FIG. 2 is a signal sequence diagram of the circuit in FIG. 1.

As illustrated in FIG. 2, in an embodiment of the present disclosure, the clock cycle of the first clock signal CLK1 is T1, the clock cycle of the second clock signal CLK0 is T0, the divided signal CLKX refers to the frequency of the first clock signal CLK1 divided by 8, the first reset pulse signal RSTB_a is generated at the rising edge of the divided signal CLKX, and the second reset pulse signal RSTB_b is generated at the falling edge of the divided signal CLKX, the low-level width of the first pulse-width modulated signal PWMA and the low-level width of the second pulse-width modulated signal PWMB being both equal to 4 times the clock cycle of the second clock signal CLK0; the first pulse-width modulated signal PWMA and the second pulse-width modulated signal PWMB are subjected to a logic AND operation to produce two ways of complementary pulse-width modulated signals; the frequency of the pulse-width modulated signal PWM_OUT is twice the frequency of the first pulse-width modulated signal PWMA (in most cases, the multiplicity relationship is 2; however, it is not the case in some edge conditions), PWM_OUT=PWMA & PWMB, PWM_OUTB=−(PWMA & PWMB); then, the average duty cycle of PWM_OUT is Duty=(4*T1−4*T0)/(4*T1)=(T1−T0)/T1=1−T0/T1; while the average duty cycle of PWM_OUTB is Duty=(4*T0)/(4*T1)=T0/T1.

Embodiments of the present disclosure offer a high precision, a system stability, and a good anti-interference.

Although the present disclosure has been described in detail through the foregoing preferred embodiments, it should be understood that the illustrations above shall not be regarded as limitations to the present disclosure. The algorithm above is only illustrative, and any algorithm involving two frequency signals and a pulse-width modulated signal falls within the spirit of the present disclosure. After those skilled in the art having read the contents above, many modifications and substitutions to the present disclosure are all obvious.

What is claimed is:

1. A dual clock signal to pulse-width modulated signal conversion circuit comprising:
   an input end configured to receive a first clock signal and a second clock signal, and
   an output end configured to provide a first pulse-width modulated signal;
   wherein a first clock cycle of the first clock signal is greater than or equal to a second clock cycle of the second clock signal;
   a high level average duty cycle of the first pulse-width modulated signal is equal to at least one of a ratio of the second clock cycle of the second clock signal to the first clock cycle of the first clock signal cycle, multiplied by a proportionality coefficient, and 1 minus the ratio of the second clock cycle of the second clock signal to the first clock cycle of the first clock signal, multiplied by the proportionality coefficient K, such that the high level average duty cycle is determined by at least one of the equations:

$K \times (T0/T1);$ and
   $1-K \times (T0/T1)$, wherein T1 represents the first clock cycle, T0 represents the second clock cycle and K represents the proportionality coefficient;
   a pulse-width modulation circuit including a first input configured to receive the first clock signal and the second clock signal, and a first output configured to provide a first intermediary pulse-width modulated signal and a second intermediary pulse-width modulated signal; and
   a logic processing circuit including a second input configured to receive the first intermediary pulse-width modulated signal and the second intermediary pulse-width modulated signal, and a second output configured to provide the pulse-width modulated signal.

2. The dual clock signal to pulse-width modulated signal conversion circuit according to claim 1, wherein the proportionality coefficient is $½^n$, where n is an integer.

3. The dual clock signal to pulse-width modulated signal conversion circuit according to claim 2, wherein n is 0.

4. The dual clock signal to pulse-width modulated signal conversion circuit according to claim 1, wherein a low-level pulse duration and a high-level pulse duration of the pulse-width modulated signal are both equal to an integer multiple of the second clock cycle of the second clock signal.

5. The dual clock signal to pulse-width modulated signal conversion circuit according to claim 1, wherein a first average frequency of the first intermediary pulse-width modulated signal is equal to a second average frequency of the second intermediary pulse-width modulated signal, and a third cycle of the first intermediary pulse-width modulated signal and a fourth cycle of the second intermediary pulse-width modulated signal are equal to an integer multiple of the second clock cycle of the second clock signal.

6. The dual clock signal to pulse-width modulated signal conversion circuit according to claim 1, wherein a first low-level average duty cycle of the first intermediary pulse-width modulated signal and a second low-level average duty cycle of the second intermediary pulse-width modulated signal are equal to at least one of ½ of the ratio of the second clock cycle of the second clock signal to the first clock cycle of the first clock signal and 1 minus ½ of the ratio of the second clock cycle of the second clock signal to the first clock cycle of the first clock signal.

7. The dual clock signal to pulse-width modulated signal conversion circuit according to claim 1, wherein a first average frequency of the first intermediary pulse-width modulated signal is equal to a second frequency of a divided signal, and a low-level pulse duration and a high-level pulse duration of the first intermediary pulse-width modulated signal are both an integer multiple of the second clock cycle of the second clock signal, wherein a third average frequency of the second intermediary pulse-width modulated signal is equal to the second frequency of the divided signal, and a low-level pulse duration and a high-level pulse duration of the second intermediary pulse-width modulated signal are both an integer multiple of the second clock cycle of the second clock signal.

8. The dual clock signal to pulse-width modulated signal conversion circuit according to claim 1, wherein the logic processing circuit performs a logic AND operation on the first intermediary pulse-width modulated signal and the second intermediary pulse-width modulated signal.

9. The dual clock signal to pulse-width modulated signal conversion circuit according to claim 1, wherein the pulse-width modulation circuit comprises:
   a first counter, configured to receive the first clock signal, and provide a divided signal;
   an edge reset circuit configured to receive the divided signal and provide a first reset pulse signal and a second reset pulse signal, the first reset pulse signal being configured for resetting a second counter, and the second reset pulse signal being configured for resetting a third counter;
   the second counter configured to receive the second clock signal and the first reset pulse signal, and provide the first intermediary pulse-width modulated signal;
   a third counter configured to receive the second clock signal and the second reset pulse signal, and provide the second pulse-width modulated signal.

10. The dual clock signal to pulse-width modulated signal conversion circuit according to claim 9, wherein a fourth cycle of the divided signal is an integer multiple of the first clock cycle of the first clock signal.

11. The dual clock signal to pulse-width modulated signal conversion circuit according to claim 9, wherein the edge reset circuit generates the first reset pulse signal at a rising edge of the divided signal, and generates the second reset pulse signal at the falling edge of the divided signal.

\* \* \* \* \*